(12) United States Patent
Lee

(10) Patent No.: US 6,769,461 B1
(45) Date of Patent: Aug. 3, 2004

(54) APPARATUS FOR DISCHARGING WASTE GAS IN SEMICONDUCTOR MANUFACTURING PROCESS

(76) Inventor: Sun-Young Lee, 54-4 Singeonji-Dong, Anseong-Si, Gyeonggi-Do (KR)

(*) Notice: Subject to any disclaimer, the term of this patent is extended or adjusted under 35 U.S.C. 154(b) by 0 days.

(21) Appl. No.: 10/726,861

(22) Filed: Dec. 2, 2003

(51) Int. Cl.$^7$ .................................................. B65B 1/04
(52) U.S. Cl. .............................. 141/65; 141/82; 454/43; 454/49
(58) Field of Search .................... 141/65, 66, 83, 141/98; 454/43, 49, 66, 187

(56) References Cited

U.S. PATENT DOCUMENTS

| | | | |
|---|---|---|---|
| 5,431,600 A | * | 7/1995 | Murata et al. ............... 454/187 |
| 6,241,597 B1 | * | 6/2001 | Chiang et al. ................ 454/49 |
| 6,704,088 B2 | * | 3/2004 | Tanimoto ..................... 355/30 |

* cited by examiner

*Primary Examiner*—Steven O. Douglas
(74) *Attorney, Agent, or Firm*—G W i P S

(57) ABSTRACT

An apparatus is developed for discharging a waste gas in a semiconductor (or TFT-LCD) manufacturing process. The present invention has its purpose to constantly set the amount of purge of nitrogen for inducing the waste gas to discharge while increasing a temperature of the waste gas so that dust of the waste gas is not accumulated on the inner wall of a pipe, and prevent an accident such as a burn from occurring in workers. The apparatus includes an inlet transfer 100 having an inlet port 102 and a support rib 104, a discharge transfer 140 having a support jaw 144 fixed to a support rib and forming a blow-off gap 110 along with the inlet transfer, a transfer cap 160 coupled to the top of the inlet transfer, while surrounding the discharge transfer, a heating casing 180 forming a heating room 182 and having a nitrogen inlet port 184, an electric heat wire 200 disposed within the heating room, and a temperature sensor 220 for controlling a temperature of the electric heat wire. The apparatus may further comprise a burn-preventing cap 240 surrounding a heating casing 180 with a given distance from the outer circumferential face of the heating casing.

2 Claims, 5 Drawing Sheets

APPARATUS FOR DISCHARGING WASTE GAS IN SEMICONDUCTOR MANUFACTURING PROCESS

BACKGROUND OF THE INVENTION

1. Field of the Invention

The present invention relates to an apparatus for discharging a waste gas in a semiconductor manufacturing process. More particularly, the present invention relates to an apparatus for discharging a waste gas in a semiconductor manufacturing process, which can keep constant the amount of purge of nitrogen for inducing the waste gas to discharge while increasing a temperature of the waste gas so that dust of the waste gas is not accumulated on the inner wall of a pipe, and prevent an accident such as a burn from generating in workers.

2. Related Prior Art

Generally, in a semiconductor manufacturing process, for example, a wafer treatment process, an oxide film is formed on a wafer by supplying a various kinds of reaction gases to a wafer disposed within a chamber. Such reaction gases are highly noxious and are thus fatal to the human body. Further, there is a possibility that they may explode when being mixed with other gases or air. Therefore, they have to be converted into harmless gases through reaction and be then discharged.

FIG. 6 shows a system for discharging those waste gases after reaction. A reaction gas within a chamber 10 for processing a wafer is discharged through a vacuum pump 12. The gas is burnt and purified by a gas scrubber 16 connected to an exhaust line of the vacuum pump 12 through a valve 14.

In such a waste gas discharge system, however, as the valve 14 employs a mechanical open/close mode by a Bellows, etc. using pneumaticity, the valve 12 is damaged by solidification of dust due to the cooling of the waste gas. For this reason, there is a problem that the process is stopped. Furthermore, if the exhaust line to the gas scrubber 16 is increased, the waste gas is cooled while moving to the exhaust line. Thus there is a danger that the exhaust line may be closed due to solidified dusts. In order to prevent this, an additional processing device must be installed in the exhaust line. This makes the structure complicated.

Considering this problem, the present applicant proposed the Korean Utility Model No. 209874 entitled "Waste Gas Inducing Device" as shown in FIG. 7. As seen in FIG. 7, this device includes an inlet transfer 20 having an inlet port 22 on its outer circumferential face, a discharge transfer 30 inserted into the inlet transfer 20 with an O-ring 34 intervened between them, so that a blow-off gap 32 communicating with the inlet port 22 is formed between the inner circumferential face of the inlet transfer 20 and the bottom of the discharge transfer 30, a heating casing 40 installed around the inlet transfer 20 to form a heating room 42 and having a nitrogen inlet port 44 formed an outer circumferential face, an electric heat wire 50 surrounding the inlet transfer 20 within the heating room 42, and a temperature sensor 60 disposed at the exit of the discharge transfer 30 for controlling a temperature of the electric heat wire 50.

The device may be disposed between the chamber and the vacuum pump, and at the front or rear stage of a subsequent exhaust line or the gas scrubber in the vacuum pump. According to this device, if nitrogen is forcibly sent to the heating room 42 through the nitrogen inlet port 44, nitrogen is heated by the electric heat wire 50 and is then blown off into the discharge transfer 30 through the inlet port 22 and the blow-off gap 32. The blown-off nitrogen is mixed with the waste gas introduced via the inlet of the inlet transfer 20, thus keeping high a temperature of the waste gas so that it is not cooled. Accordingly, dusts of the waste gas are prevented from being stacked. Furthermore, such nitrogen functions to increase the amount of the waste gas introduced into the inlet transfer 20 by means of a purge discharge through the blow-off gap 32.

In the conventional device, however, as the discharge transfer 30 is fixed to the inlet transfer 20 by means of the O-ring 34 in order to keep the blow-off gap 32, the blow-off gap 32 is changed due to fluctuation of the discharge transfer 30. For this reason, the amount of purge of nitrogen is not uniform. As a result, there is a problem that the blow-off gap 32 keeps unstable due to nitrogen. In addition, as a hot heating casing 40 is exposed outwardly, there is a danger that a worker may be burnt while touching the heating casing 40.

SUMMARY OF THE INVENTION

Accordingly, the present invention has been made in view of the above problems, and it is an object of the present invention to provide an apparatus for discharging a waste gas in a semiconductor manufacturing process, which can keep constant the amount of purge of nitrogen for inducing the waste gas to discharge while increasing a temperature of the waste gas so that dust of the waste gas is not accumulated.

Another object of the present invention is to prevent an accident such as a burn, etc. from generating in workers.

According to a preferred embodiment of the present invention, there is provided an apparatus for discharging a waste gas in a semiconductor (or TFT-LCD) manufacturing process, including an inlet transfer having an inlet port disposed at its outer circumferential face and a support rib disposed at its inner circumferential face; a discharge transfer having a support jaw fixed to a support rib at its outer circumferential face, wherein the discharge transfer is inserted into the inlet transfer so that a blow-off gap communicating with the inlet port is formed between the bottom of the discharge transfer and the inner circumferential face of the inlet transfer and a high-pressure gas room communicating with the inlet port and the blow-off gap is formed between the outer circumferential face of the discharge transfer and the inner circumferential face of the inlet transfer; a transfer cap having the bottom coupled to the top of the inlet transfer, while surrounding the discharge transfer; a heating casing disposed around the inlet transfer and the transfer cap to form a heating room, and having a nitrogen inlet port disposed on its outer circumferential face; an electric heat wire disposed within the heating room; and a temperature sensor for controlling a temperature of the electric heat wire.

According to the present invention, a burn-preventing cap surrounding a heating casing may be further provided with a given distance from the outer circumferential face of the heating casing.

DETAILED DESCRIPTION OF PREFERRED EMBODIMENTS

Now the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later.

Figure 1:
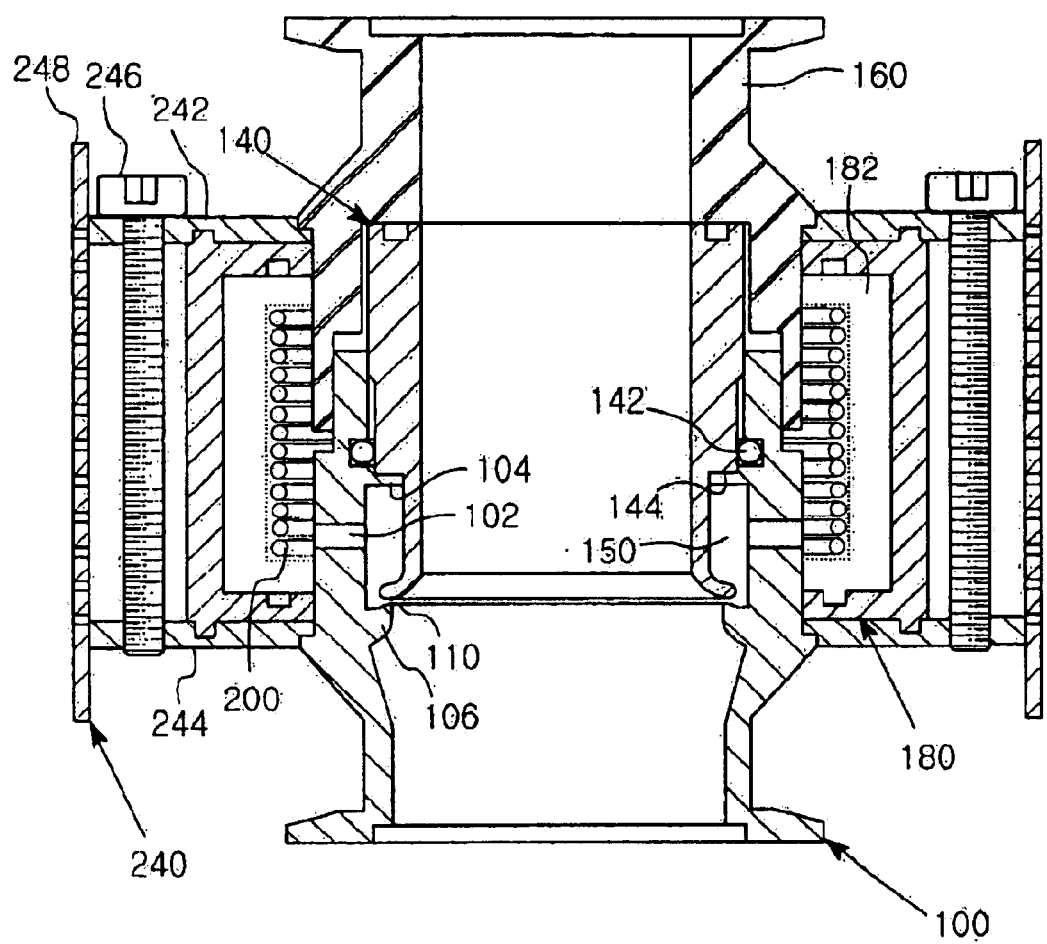
FIG. 1 is a cross-sectional view showing a waste gas discharge apparatus used for a semiconductor (or TFT-LCD) manufacturing process according to the present invention.
Figure 2:
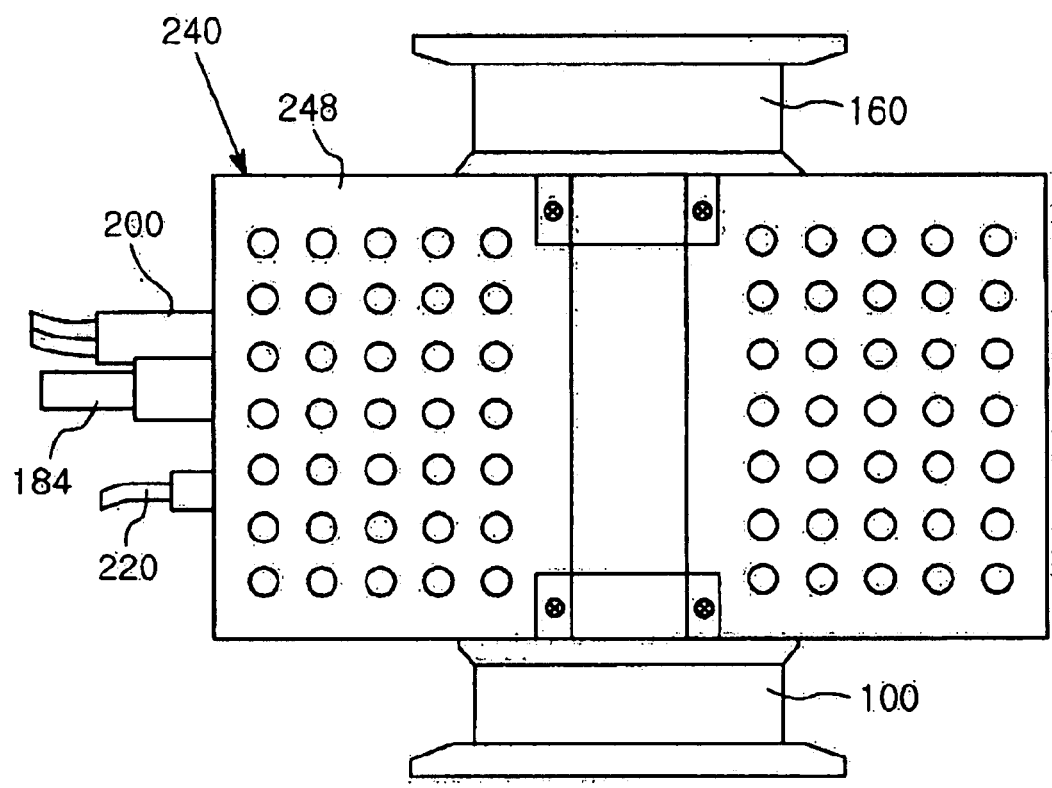
FIG. 2 is a front view showing the waste gas discharge apparatus used for the semiconductor (or TFT-LCD) manufacturing process according to the present invention.

FIG. 1 and FIG. 2 each illustrate a cross-sectional view and a front view of a waste gas discharge apparatus used for a semiconductor (or TFT-LCD) manufacturing process according to the present invention.

Referring to FIG. 1 and FIG. 2, the apparatus of the present invention consists of an inlet transfer 100, a discharge transfer 140, a transfer cap 160, a heating casing 180, an electric heat wire 200 and a temperature sensor 220.

The inlet transfer 100 has a tube shape whose top and bottom are open. The inlet port 102 is disposed on the outer circumferential face of the transfer 100. The inlet port 102 may be formed in plural. Furthermore, a support rib 104 for supporting the discharge transfer 140 is disposed at an approximate upper portion of the inner circumferential face of the inlet transfer 100 and a guide rib 106 for forming a blow-off gap 110 is disposed at an approximate middle portion of the inner circumferential face. It is preferred that the top surface of the guide rib 106 is formed with a slant upwardly.

The discharge transfer 140 is inserted into the upper portion of the inlet transfer 100 with the O-ring 142 intervened between them. The discharge transfer 140 has a support jaw 144 fixed to the support rib 104 of the inlet transfer 100 at the outer circumferential face. The discharge transfer 140 also has a tube shape whose top and bottom are open. The blow-off gap 110 communicating with the inlet port 102 is disposed between the bottom of the discharge transfer 140 and the inner circumferential face of the inlet transfer 100. Also a high-pressure gas room 150 communicating with the inlet port 102 and the blow-off gap 110 is disposed between the outer circumferential face of the discharge transfer 140 and the inner circumferential face of the inlet transfer 100. It is preferred that the bottom of the discharge transfer 140 has a shape expanded along the curved side in order to guide the blow-off of nitrogen through the blow-off gap 110 toward the discharge transfer 140, as will be described later.

The transfer cap 160 has a tube shape whose top and bottom are open. The transfer cap 160 has the bottom coupled to the top of the inlet transfer 100, while surrounding the discharge transfer 140. In other words, the discharge transfer 140 has the bottom inserted into the inlet transfer 100 and the top inserted into the transfer cap 160. With this structure, fluctuation of the discharge transfer 140 due to a blow-off pressure of nitrogen, surrounding environments, thermal deformation, and the like can be prevented. Further, as the size of the blow-off gap 110 is kept constant, the amount of purge of nitrogen can be set constant.

The heating casing 180 is disposed around the inlet transfer 100 and the transfer cap 160 to form a heating room 182. A nitrogen inlet port 184 is disposed on the outer circumferential face of the heating casing 180. At this time, the heating room 182 must communicate with the inlet port 102 of the discharge transfer 140. Accordingly, nitrogen introduced into the heating room 182 via the nitrogen inlet port 184 can be blown off toward the discharge transfer 140 through the inlet port 102, the high-pressure gas room 150 and the blow-off gap 110.

It is preferable that the electric heat wire 200 is disposed to surround the inlet transfer 100 and the transfer cap 160 within the heating room 182. A temperature sensor 220 for controlling a temperature of the electric heat wire 200 is disposed in the heating room 182. Therefore, nitrogen introduced into the heating room 182 is heated to a certain temperature by means of generation of heat by the electric heat wire 200 and is then blown off toward the discharge transfer 140 through the inlet port 102, the high-pressure gas room 150 and the blow-off gap 110.

Figure 3:
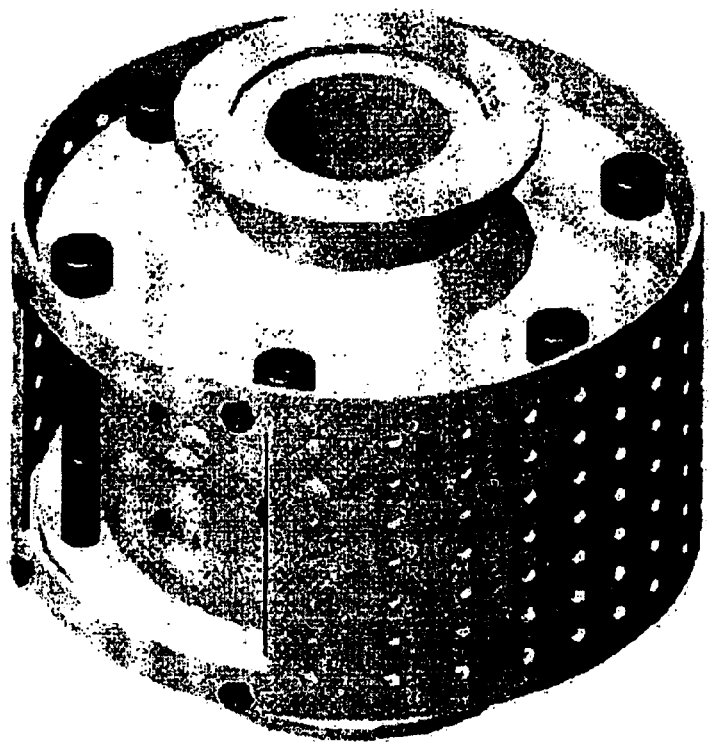
FIG. 3 is an image showing the waste gas discharge apparatus used for the semiconductor (or TFT-LCD) manufacturing process according to the present invention.
Figure 4:
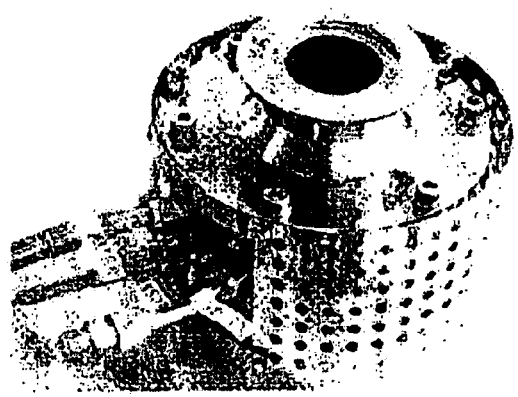
FIG. 4 is a photography showing the waste gas discharge apparatus used for the semiconductor (or TFT-LCD) manufacturing process according to the present invention.

Meanwhile, according to the present invention, a burn-preventing cap 240 surrounding the heating casing 180 can be further provided with a given distance from the outer circumferential face of the heating casing 180. In the concrete, the burn-preventing cap 240 includes an upper plate 242 covering the top of the heating casing 180, a lower plate 244 covering the bottom of the heating casing 180 and coupled to the upper plate 242 by bolts 246, and a shield net 248 disposed over the upper/lower plates 242, 244 and surrounding the heating casing 180 with a given distance from the outer circumferential face of the heating casing 180. As shown in FIG. 2 to FIG. 4, one of outer circumferential faces of the shield net 248 must be open so that a leading portion of each of the nitrogen inlet port 184, the temperature sensor 220 and the electric heat wire 200 can be leaded therefrom.

The operation of the apparatus for discharging the waste gas in the semiconductor manufacturing process constructed will now be described.

The apparatus for discharging the waste gas in the semiconductor manufacturing process is disposed, for example, between the chamber and the vacuum pump, and at the front/rear of the exhaust line of the vacuum pump or the gas scrubber and is used to exhaust a reaction gas of the chamber, i.e., the waste gas.

Figure 5:
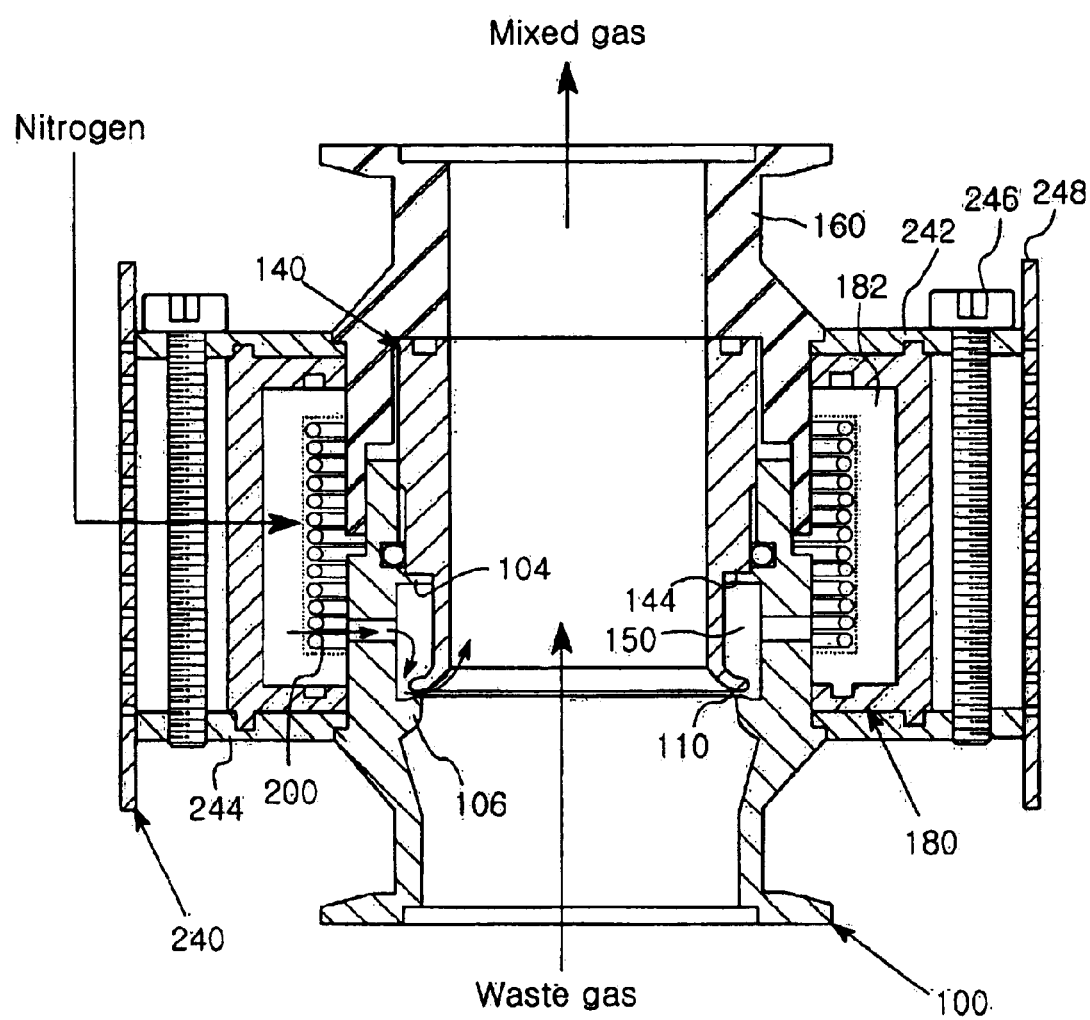
FIG. 5 is a cross-sectional view showing the waste gas discharge apparatus used for the semiconductor (or TFT-LCD) manufacturing process according to the present invention.
Figure 6:
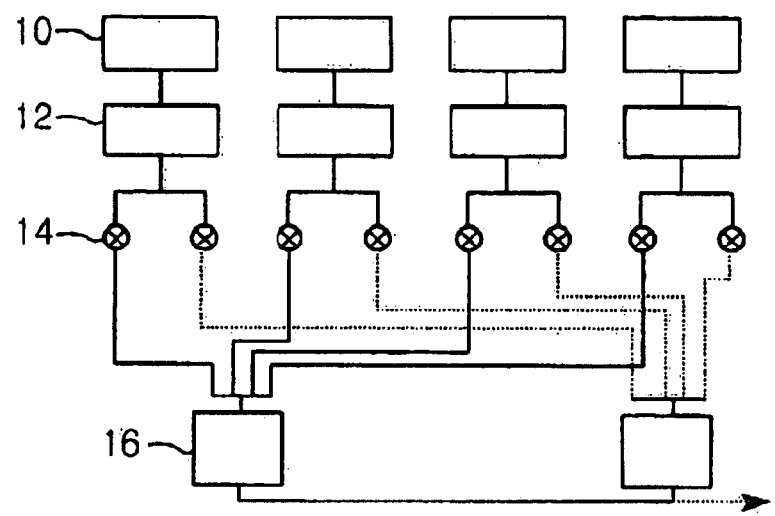
FIG. 6 is a block diagram illustrating a waste gas discharge apparatus used for a semiconductor (or TFT-LCD) manufacturing process according to a prior art.
Figure 7:
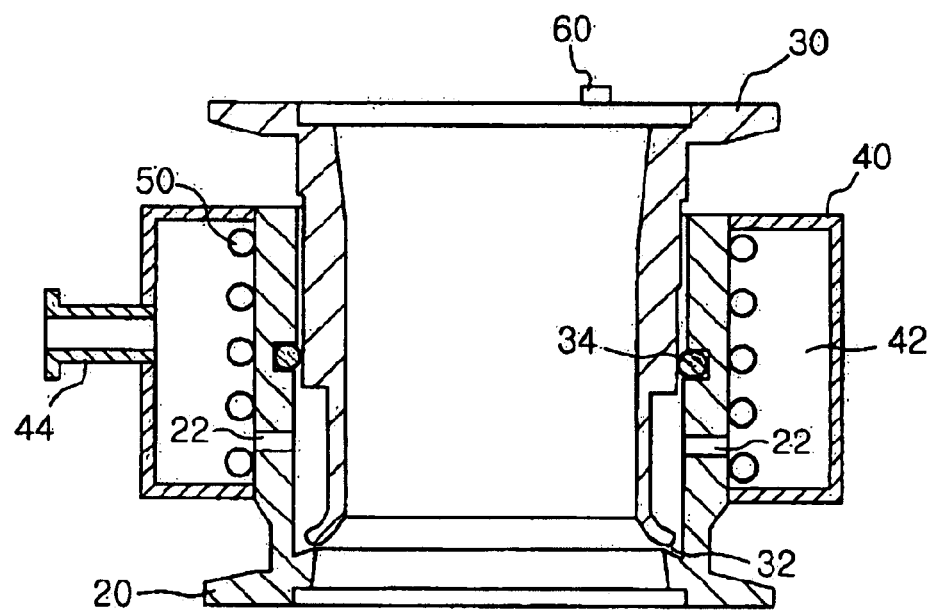
FIG. 7 is a cross-sectional view showing a waste gas discharge apparatus used for a semiconductor (or TFT-LCD) manufacturing process according to a prior art.

In other words, as shown in FIG. 5, if nitrogen is forcibly sent to the heating room 182 through the nitrogen inlet port 184, it is heated by the electric heat wire 200. The heated nitrogen is blown off into the discharge transfer 140 through the inlet port 102, the high-pressure gas room 150 and the blow-off gap 110 sequentially. That is, the blow-off of nitrogen is induced to the discharge transfer 140 by means of the curved portion that is disposed at the top of the guide rib 106 and the bottom of the discharge transfer 140 that are upwardly slanted to form the blow-off gap 110.

Nitrogen blown off into the discharge transfer 140 is mixed with the waste gas introduced via the inlet of the inlet transfer 100. Accordingly, as the waste gas is kept at given temperature by nitrogen of a high temperature so that it is not cooled, stacking and solidification of dusts are prevented. Furthermore, the amount of the waste gas introduced into the inlet transfer 100 is increased by a purge blow-off of nitrogen toward the inside of the discharge transfer 140 through the blow-off gap 110. In the present invention, the blow-off gap 110 is kept with a given size by means of the discharge transfer 140 supported by the support rib 104, while the discharge transfer 140 is not fluctuated due to the support rib 104 and the transfer cap 160. Therefore, the amount of purge of nitrogen is set constant. As a result, the function of preventing the stacking and solidification of the dusts by nitrogen can be significantly increased compared to a prior art.

Furthermore, in the process of discharging the waste gas, the burn preventing cap 240 functions to prevent a worker from touching the heating casing 180 of a high temperature. It can thus prevent an accident such as a burn from occurring in works.

In the present invention, it has been described that the waste gas is not cooled by nitrogen, while the amount of discharge of the waste gas is increased. If there is no problem due to a reaction with the waste gas, air or other gases can be used instead of nitrogen. It is considered that this falls within the scope of the present invention.

According to the present invention, the discharge transfer 140 is supported by the support rib 104, while fluctuation of the discharge transfer 140 is not prevented by the transfer cap 160. The blow-off gap 110 is thus kept constant. Therefore, there is an effect that it is possible to prevent the waste gas from becoming dusts and to increase the amount of the waste gas discharged.

Furthermore, the burn preventing cap 240 functions to prevent an accident such a burn, etc. from happening. Workers can work under a safe working condition.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A apparatus for discharging a waste gas in a semiconductor manufacturing process, comprising:

an inlet transfer 100 having an inlet port 102 disposed at its outer circumferential face and a support rib 104 disposed at its inner circumferential face;

a discharge transfer 140 having a support jaw 144 fixed to a support rib at its outer circumferential face, wherein the discharge transfer 140 is inserted into the inlet transfer 100 so that a blow-off gap 110 communicating with the inlet port is disposed between the bottom of the discharge transfer 140 and the inner circumferential face of the inlet transfer 100 and a high-pressure gas room 150 communicating with the inlet port and the blow-off gap is formed between the outer circumferential face of the discharge transfer 140 and the inner circumferential face of the inlet transfer 100;

a transfer cap 160 having the bottom coupled to the top of the inlet transfer, while surrounding the discharge transfer;

a heating casing 180 disposed around the inlet transfer and the transfer cap to form a heating room 182, and having a nitrogen inlet port 184 disposed on its outer circumferential face;

an electric heat wire 200 disposed within the heating room; and a temperature sensor 220 for controlling a temperature of the electric heat wire.

2. The apparatus as claimed in claim 1, further comprising a burn preventing cap 240 surrounding a heating casing 180 with a given distance from the outer circumferential face of the heating casing.

* * * * *